United States Patent
Ohdaira et al.

(10) Patent No.: US 7,986,004 B2
(45) Date of Patent: Jul. 26, 2011

(54) SEMICONDUCTOR DEVICE AND METHOD OF MANUFACTURE THEREOF

(75) Inventors: Akira Ohdaira, Toyama (JP); Hisaji Nishimura, Toyama (JP); Hiroyoshi Ogura, Toyama (JP)

(73) Assignee: Panasonic Corporation, Osaka (JP)

( * ) Notice: Subject to any disclaimer, the term of this patent is extended or adjusted under 35 U.S.C. 154(b) by 471 days.

(21) Appl. No.: 11/802,668

(22) Filed: May 24, 2007

(65) Prior Publication Data
US 2007/0296046 A1 Dec. 27, 2007

(30) Foreign Application Priority Data
Jun. 21, 2006 (JP) .................... 2006-170795

(51) Int. Cl.
*H01L 29/76* (2006.01)
(52) U.S. Cl. ........... 257/335; 257/341; 257/E29.256; 257/E21.417; 438/298
(58) Field of Classification Search .......... 257/401, 257/328, 376, 339, 355, 409, 335–336, 341–343, 257/927, E29.256, E29.261, E21.417; 438/197, 438/286, 289, 297–298
See application file for complete search history.

(56) References Cited

U.S. PATENT DOCUMENTS

| 5,548,150 | A | * | 8/1996 | Omura et al. ............ 257/349 |
| 6,034,416 | A | * | 3/2000 | Uehara et al. ............ 257/623 |
| 6,168,983 | B1 | * | 1/2001 | Rumennik et al. ........ 438/188 |
| 6,424,007 | B1 | * | 7/2002 | Disney .................... 257/342 |
| 6,803,629 | B2 | * | 10/2004 | Tihanyi .................. 257/342 |
| 2001/0000288 | A1 | * | 4/2001 | Oh ........................ 257/409 |
| 2004/0113210 | A1 | * | 6/2004 | Chau et al. .............. 257/401 |
| 2005/0045922 | A1 | * | 3/2005 | Ahlers et al. ............ 257/242 |
| 2008/0093641 | A1 | * | 4/2008 | Ludikhuize et al. ...... 257/289 |

FOREIGN PATENT DOCUMENTS
JP 60-20560 2/1985
* cited by examiner

*Primary Examiner* — Matthew W Such
*Assistant Examiner* — Ali Naraghi
(74) *Attorney, Agent, or Firm* — Steptoe & Johnson LLP

(57) ABSTRACT

In a high withstand voltage transistor of a LOCOS offset drain type having a buried layer, a plurality of stripe-shaped diffusion layers are formed below a diffusion layer ranging from an offset layer to a drain layer and a portion between the drain region and the buried layer is depleted completely; thus, a withstand voltage between the drain region and the buried layer is improved. By the formation of the stripe-shaped diffusion layers, the drain region becomes widened; thus, on-resistance is reduced. Further, the buried layer is made high in concentration so as to sufficiently suppress an operation of a parasitic bipolar transistor.

6 Claims, 11 Drawing Sheets

SEMICONDUCTOR DEVICE AND METHOD OF MANUFACTURE THEREOF

The present application claims priority to Japanese Patent Application No. 2006-170795, filed Jun. 21, 2006, which application is incorporated herein by reference in its entirety.

BACKGROUND OF THE INVENTION (1) Field of the Invention

The present invention relates to a semiconductor device, in particular, a high withstand voltage MOS transistor of a LOCOS (Local Oxidation of Silicon) offset drain type having a buried layer, and a method of manufacture thereof.

(2) Description of the Related Art

Occasionally, a MOS field effect transistor (MOSFET) in a motor driven/controlled integrated circuit or the like is used in such a manner that a high voltage of, for example, more than several tens of volts is applied to a drain region.

As a type of such high withstand voltage MOS transistor, there is known a LOCOS offset drain type in which an offset layer with a relatively low concentration is provided around a drain layer with a high concentration formed on a surface of a semiconductor substrate in order to secure a drain withstand voltage.

However, a vertical parasitic bipolar transistor disadvantageously operates in this structure, thereby leading to an erroneous operation of circuitry in some cases. In order to avoid this disadvantage, there is proposed a high withstand voltage MOS transistor having a buried layer (refer to, e.g., JP60-020560A).

FIG. 18 illustrates a conventional high withstand voltage MOS transistor of a LOCOS offset drain type having a P-type channel.

This semiconductor device has the following structure. That is, a LOCOS oxide film 205 is formed between a $P^+$-type high concentration drain layer 208A and an end of a gate electrode 207 made of polysilicon such that the end of the gate electrode 207 is offset from the $P^+$-type high concentration drain layer 208A serving as a drain region. This prevents an electric field from being concentrated on the end of the gate electrode 207.

In addition, a P-type offset layer 204 of a conductivity type equal to that of the drain region is formed below the LOCOS oxide film 205. The P-type offset layer 204 has an impurity concentration lower than that of the $P^+$-type high concentration drain layer 208A. Further, an $N^+$-type buried layer 202 is formed for controlling an operation of a vertical parasitic PNP bipolar transistor having a $P^+$-type high concentration source layer 208B (or the $P^+$-type high concentration drain layer 208A) serving as an emitter, an $N^-$-type epitaxial layer 203 serving as a base and a $P^-$-type silicon substrate 201 serving as a collector. Herein, a gate oxide film 206 is also illustrated in FIG. 18.

By formation of the $N^+$-type buried layer 202, the vertical parasitic PNP bipolar transistor having the $P^+$-type high concentration source layer 208B (or the $P^+$-type high concentration drain layer 208A) serving as an emitter, the $N^-$-type epitaxial layer 203 serving as a base and the $P^-$-type silicon substrate 201 serving as a collector is allowed to have a high concentration (of the $N^-$-type epitaxial layer 203). Thus, it is possible to suppress a parasitic operation.

However, this conventional technique has the following problems.

In a conventional high withstand voltage MOS transistor of a LOCOS offset drain type having a P-type channel, a depletion layer from a $P^+$-type drain layer reaches an $N^+$-type buried layer with a high concentration and the depletion layer is difficult to extend, so that an electric field is concentrated on a portion between the $P^+$-type drain layer and the $N^+$-type buried layer. Accordingly, a withstand voltage is determined.

In order to solve the above problem, even if a distance between a drain and a source is widened, a concentration profile of an offset layer is optimized, or a buffer layer is formed between a drain layer and an offset layer such that a lateral electric field is relaxed, it is difficult to improve a withstand voltage.

In order to improve a withstand voltage, it is necessary to improve a withstand voltage between a $P^+$-type drain layer and an $N^+$-type buried layer in the following manner. A film thickness of an epitaxial layer is made large or a concentration of the epitaxial layer is made high such that a depletion layer is prevented from reaching a buried layer. Alternatively, a concentration of the buried layer is made low such that the depletion layer extends into the buried layer.

However, if the film thickness of the epitaxial layer is made large, an isolation layer must be diffused deeper in a case where element isolation is achieved by PN junction isolation. Consequently, an element area is increased due to widening of lateral diffusion. Further, if the concentration of the epitaxial layer is made high, occasionally, a withstand voltage is reduced or on-resistance is increased depending on a relationship in concentration between the epitaxial layer and a P-type offset layer or a $P^+$-type drain layer. Moreover, if the concentration of the buried layer is made low, a concentration of a base layer in a vertical parasitic bipolar transistor becomes low, so that an operation of a parasitic bipolar transistor is increased.

Due to the aforementioned problems, it is difficult to improve a withstand voltage, reduce on-resistance and suppress an operation of a parasitic bipolar transistor simultaneously without an increase in element area.

SUMMARY OF THE INVENTION

An object of the present invention is to provide a high withstand voltage MOS transistor of a LOCOS offset drain type capable of improving a withstand voltage, reducing on-resistance and suppressing an operation of a parasitic bipolar transistor simultaneously without an increase in element area.

According to a first aspect of the present invention, there is provided a semiconductor device including an offset drain-type MOS transistor having a channel of a first conductivity type formed on a semiconductor substrate. The semiconductor device includes: a semiconductor substrate of a first conductivity type; a semiconductor layer of a second conductivity type epitaxially grown on the semiconductor substrate; a buried layer of the second conductivity type formed between the semiconductor substrate and the semiconductor layer; a drain region including a high concentration drain layer of the first conductivity type formed on a surface of the semiconductor layer; a source region including a high concentration source layer of the first conductivity type formed on the surface of the semiconductor layer; a gate oxide film formed between the drain region and the source region and on an active region on the surface of the semiconductor layer; a LOCOS oxide film formed between the drain region and the gate oxide film and on the surface of the semiconductor layer; a gate electrode formed on the gate oxide film so as to partially cover the LOCOS oxide film; an offset layer of the first conductivity type formed below the LOCOS oxide film; and a plurality of stripe-shaped diffusion layers of the first conductivity type formed in the semiconductor layer below the offset layer and the drain layer. That is, the plurality of stripe-shaped diffusion layers of the first conductivity type are formed between the diffusion layer of the first conductivity type ranging from the offset layer to the high concentration drain layer and the buried layer of the second conductivity type.

According to a second aspect of the present invention, there is provided a semiconductor device including an offset drain-type MOS transistor having a channel of a first conductivity type formed on a semiconductor substrate. The semiconductor device includes: a semiconductor substrate of a first conductivity type; a buried oxide film formed on the semiconductor substrate; a semiconductor layer of a second conductivity type formed on the buried oxide film; a drain region including a high concentration drain layer of the first conductivity type formed on a surface of the semiconductor layer; a source region including a high concentration source layer of the first conductivity type formed on the surface of the semiconductor layer; a gate oxide film formed between the drain region and the source region and on an active region on the surface of the semiconductor layer; a LOCOS oxide film formed between the drain region and the gate oxide film and on the surface of the semiconductor layer; a gate electrode formed on the gate oxide film so as to partially cover the LOCOS oxide film; an offset layer of the first conductivity type formed below the LOCOS oxide film; and a plurality of stripe-shaped diffusion layers of the first conductivity type formed in the semiconductor layer below the offset layer and the drain layer.

According to a third aspect of the present invention, the plurality of stripe-shaped diffusion layers are formed in parallel with a drain-source direction.

According to a fourth aspect of the present invention, there is provided a method of manufacture of the semiconductor device according to the first aspect of the present invention. The method includes the steps of: forming a buried layer of a second conductivity type on a semiconductor substrate of a first conductivity type; forming an epitaxial layer of the second conductivity type on the semiconductor substrate; forming a plurality of stripe-shaped diffusion layers of the first conductivity type in the epitaxial layer by high-energy impurity implantation; forming a nitride film on the epitaxial layer with an oxide film interposed therebetween; patterning the nitride film on an active region on the epitaxial layer; forming an offset layer of the first conductivity type on the epitaxial layer with the nitride film used as a mask; forming a LOCOS oxide film on a surface of the epitaxial layer with the nitride film used as a mask; removing the nitride film after the formation of the LOCOS oxide film; forming a gate oxide film on the active region on the surface of the epitaxial layer; forming a gate electrode on the gate oxide film so as to partially cover the LOCOS oxide film; and forming a high concentration drain layer of the first conductivity type on a drain region of the epitaxial layer adjacent to the offset layer, and forming a high concentration source layer of the first conductivity type on the epitaxial layer at a position opposite to the high concentration drain layer of the first conductivity type with the gate electrode interposed therebetween. Herein, the plurality of stripe-shaped diffusion layers are formed in the semiconductor layer below the offset layer and the drain layer.

According to a fifth aspect of the present invention, there is provided a method of manufacture of the semiconductor device according to the first aspect of the present invention. The method includes the steps of: forming a buried layer of a second conductivity type on a semiconductor substrate of a first conductivity type; forming an epitaxial layer of the second conductivity type on the semiconductor substrate; forming a plurality of stripe-shaped diffusion layers of the first conductivity type on the epitaxial layer; forming an epitaxial layer of the second conductivity type on the epitaxial layer having the plurality of stripe-shaped diffusion layers formed thereon; forming a nitride film on the epitaxial layer with an oxide film interposed therebetween; patterning the oxide film and the nitride film at a portion where an active region is to be formed on the epitaxial layer; forming an offset layer of the first conductivity type on the epitaxial layer with the nitride film used as a mask; forming a LOCOS oxide film on a surface of the epitaxial layer with the nitride film used as a mask; removing the nitride film after the formation of the LOCOS oxide film; forming a gate oxide film on the active region on the surface of the epitaxial layer; forming a gate electrode on the gate oxide film so as to partially cover the LOCOS oxide film; and forming a high concentration drain layer of the first conductivity type on a drain region of the epitaxial layer adjacent to the offset layer, and forming a high concentration source layer of the first conductivity type on the epitaxial layer at a position opposite to the high concentration drain layer of the first conductivity type with the gate electrode interposed therebetween. Herein, the plurality of stripe-shaped diffusion layers are formed in the semiconductor layer below the offset layer and the drain layer.

According to a sixth aspect of the present invention, there is provided a method of manufacture of the semiconductor device according to the second aspect of the present invention. The method includes the steps of: forming a semiconductor layer of a second conductivity type on a buried oxide film in a semiconductor substrate of a first conductivity type; forming a plurality of stripe-shaped diffusion layers of the first conductivity type in the semiconductor layer; forming a nitride film on the semiconductor layer with an oxide film interposed therebetween; patterning the nitride film on an active region on the semiconductor layer; forming an offset layer of the first conductivity type on the semiconductor layer with the nitride film used as a mask; forming a LOCOS oxide film on a surface of the semiconductor layer with the nitride film used as a mask; removing the nitride film after the formation of the LOCOS oxide film; forming a gate oxide film on the active region on the surface of the semiconductor layer; forming a gate electrode on the gate oxide film so as to partially cover the LOCOS oxide film; and forming a high concentration drain layer of the first conductivity type on a drain region of the semiconductor layer adjacent to the offset layer, and forming a high concentration source layer of the first conductivity type on the semiconductor layer at a position opposite to the high concentration drain layer of the first conductivity type with the gate electrode interposed therebetween. Herein, the plurality of stripe-shaped diffusion layers are formed in the semiconductor layer below the offset layer and the drain layer.

In the semiconductor device according to the first aspect of the present invention, a depletion layer extends from a junction between the plurality of stripe-shaped diffusion layers and the semiconductor layer (the epitaxial layer), so that the portion between the diffusion layer ranging from the offset layer to the high concentration drain layer and the buried diffusion layer is depleted completely. Thus, an electric field strength becomes uniform. As a result, it is possible to improve a withstand voltage between the drain region and the buried diffusion layer. Therefore, it is unnecessary to make a thickness of the semiconductor layer large, to make a concentration of the semiconductor layer high, or make a concentration of the buried layer low. As a result, it is possible to improve a withstand voltage and to suppress an operation of a parasitic bipolar transistor without an increase in element area. In addition, since the plurality of stripe-shaped diffusion layers are formed below the diffusion layer ranging from the offset layer to the drain layer, the drain region becomes widened. As a result, it is possible to reduce on-resistance.

Desirably, the plurality of stripe-shaped diffusion layers have a concentration almost equal to that of the semiconductor layer and are provided at regular intervals.

In the semiconductor device according to the second aspect of the present invention, a portion corresponding to a base of a vertical parasitic bipolar transistor is formed of an oxide film. As a result, it is possible to completely suppress an operation of a parasitic bipolar transistor. The formation of the plurality of stripe-shaped diffusion layers has an advantage over the non-formation thereof in the following. That is, a depletion layer extends from a junction between the plurality of stripe-shaped diffusion layers and the semiconductor layer and therefore, reaches the buried oxide film at a lower voltage; thus, the drain region is readily depleted. As a result, it is possible to further improve a withstand voltage. Desirably, the plurality of stripe-shaped diffusion layer shave a concentration almost equal to that of the semiconductor layer and are provided at regular intervals.

In the semiconductor device according to the third aspect of the present invention, the plurality of stripe-shaped diffusion layers are formed in parallel with the drain-source direction. Therefore, a depletion layer extends from a junction between the plurality of stripe-shaped diffusion layers and the epitaxial layer, so that the portion between the diffusion layer ranging from the offset layer to the high concentration drain layer and the buried diffusion layer is depleted completely. Thus, an electric field strength is uniform. As a result, it is possible to improve a withstand voltage between the drain region and the buried diffusion layer. Therefore, it is unnecessary to make a thickness of the epitaxial layer large, to make a concentration of the epitaxial layer high, or make a concentration of the buried layer low. As a result, it is possible to improve a withstand voltage and to suppress an operation of a parasitic bipolar transistor without an increase in element area. In addition, since the plurality of stripe-shaped diffusion layers formed in parallel with the drain-source direction are also parallel with an electric current path. Therefore, the third aspect is superior to the first aspect in point of reduction in on-resistance. Desirably, the plurality of stripe-shaped diffusion layers have a concentration almost equal to that of the semiconductor layer and are provided at regular intervals.

By the method of manufacture of the semiconductor device according to the fourth aspect of the present invention, a depletion layer extends from a junction between the plurality of stripe-shaped diffusion layers and the epitaxial layer, so that the portion between the diffusion layer ranging from the offset layer to the high concentration drain layer and the buried diffusion layer is depleted completely. Thus, an electric field strength is uniform. As a result, it is possible to improve a withstand voltage between the drain region and the buried diffusion layer. Therefore, it is unnecessary to make a thickness of the epitaxial layer large, to make a concentration of the epitaxial layer high, or make a concentration of the buried layer low. As a result, it is possible to improve a withstand voltage and to suppress an operation of a parasitic bipolar transistor without an increase in element area. In addition, since the plurality of stripe-shaped diffusion layers are formed below the diffusion layer ranging from the offset layer to the drain layer, the drain region becomes widened. As a result, it is possible to reduce on-resistance. Further, since the plurality of stripe-shaped diffusion layers are formed by high-energy impurity implantation, controllability is enhanced.

By the method of manufacture of the semiconductor device according to the fifth aspect of the present invention, a depletion layer extends from a junction between the plurality of stripe-shaped diffusion layers and the epitaxial layer, so that the portion between the diffusion layer ranging from the offset layer to the high concentration drain layer and the buried diffusion layer is depleted completely. Thus, an electric field strength is uniform. As a result, it is possible to improve a withstand voltage between the drain region and the buried diffusion layer. Therefore, it is unnecessary to make a thickness of the epitaxial layer large, to make a concentration of the epitaxial layer high, or make a concentration of the buried layer low. As a result, it is possible to improve a withstand voltage and to suppress an operation of a parasitic bipolar transistor without an increase in element area. In addition, the concentration of the drain region can be made high in comparison with a case of high-energy impurity implantation. As a result, it is possible to further reduce on-resistance.

By the method of manufacture of the semiconductor device according to the sixth aspect of the present invention, the buried oxide film is entirely formed over the active region in the semiconductor device. As a result, it is possible to completely suppress an operation of a vertical parasitic bipolar transistor and to further improve a withstand voltage.

BRIEF DESCRIPTION OF THE INVENTION

DESCRIPTION OF THE PREFERRED EMBODIMENTS

Based on preferred embodiments illustrated in FIGS. 1 to 17, hereinafter, a description will be given of a semiconductor device and a method of manufacture thereof according to the present invention.

First Embodiment

FIGS. 1 to 5 illustrate a first embodiment of the present invention.

Figure 1:
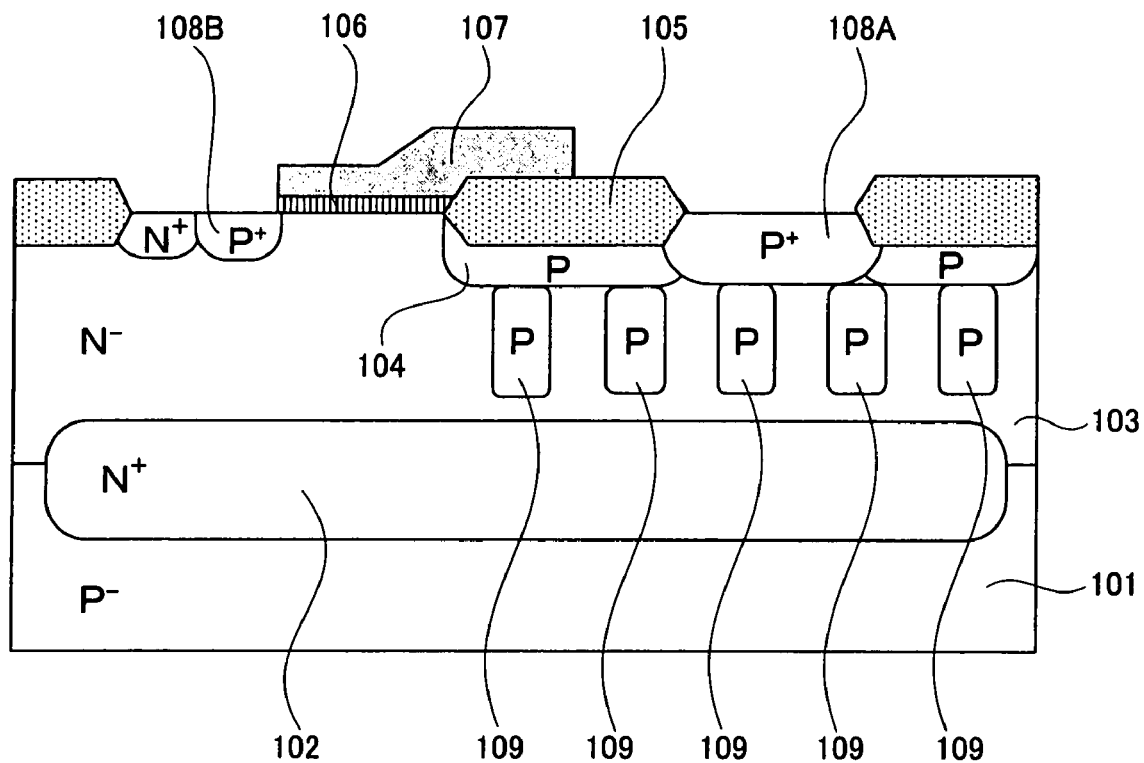
FIG. 1 is a sectional view illustrating a semiconductor device according to a first embodiment of the present invention.

FIG. 1 is a sectional view illustrating a semiconductor device according to the first embodiment. This semiconductor device is different from a conventional semiconductor device in the following point: a plurality of stripe-shaped P-type diffusion layers 109 are formed below a diffusion layer ranging from a P-type offset layer 104 to a P+-type high concentration drain layer 108A.

Specifically, a LOCOS oxide film 105 is formed between the P+-type high concentration drain layer 108A and an end of a gate electrode 107 made of polysilicon such that the end of the gate electrode 107 is offset from the P+-type high concentration drain layer 108A serving as a drain region. In addition, the P-type offset layer 104 of a conductivity type equal to that of the drain region is formed below the LOCOS oxide film 105, and an N+-type buried layer 102 is entirely formed over an active region. Further, the plurality of stripe-shaped P-type diffusion layers 109 are formed below the diffusion layer ranging from the P-type offset layer 104 to the P+-type high concentration drain layer 108A at predetermined intervals, for examples regular intervals. Herein, a gate oxide film 106 is also illustrated in FIG. 1.

Moreover, an N+-type buried layer 102 is formed for controlling an operation of a vertical parasitic PNP bipolar transistor having a P+-type high concentration source layer 108B (or the P+-type high concentration drain layer 108A) serving as an emitter, an N−-type epitaxial layer 103 serving as a base and a P−-type silicon substrate 101 serving as a collector.

FIGS. 2 to 5 illustrate a method of manufacture of the semiconductor device.

Figure 2:
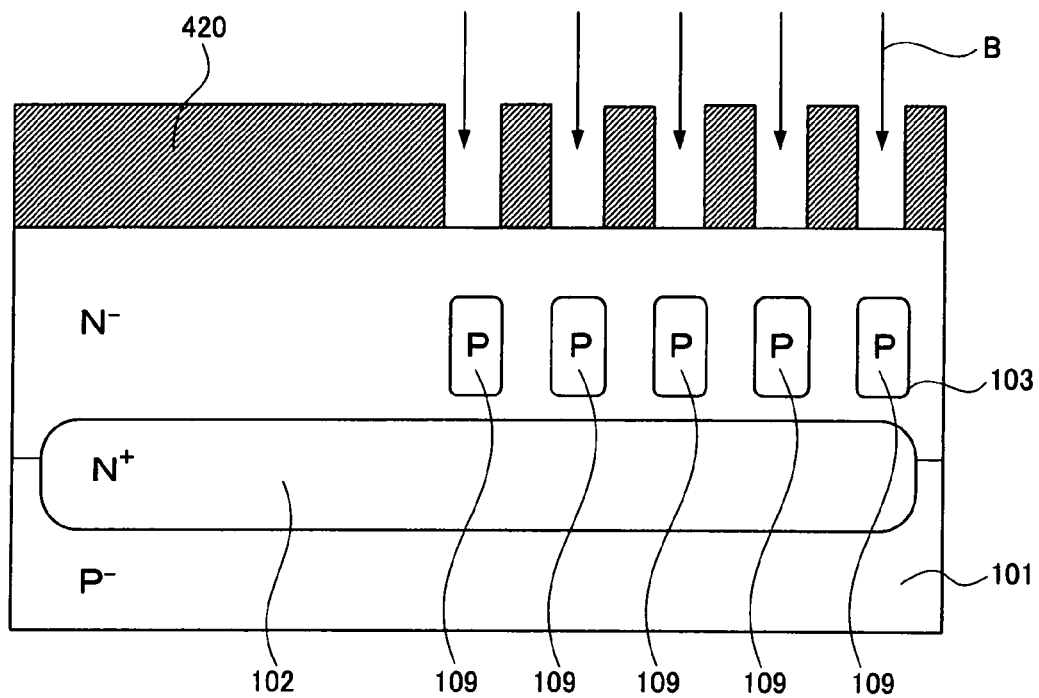
FIGS. 2 to 5 are sectional views each illustrating a method of manufacture of the semiconductor device according to the first embodiment.

First, as illustrated in FIG. 2, an N+-type buried layer 102 and an N−-type epitaxial layer 103 are sequentially formed in a P−-type silicon substrate 101. Herein, the N+-type buried layer 102 has an impurity concentration in a range from $1\times10^{18}/cm^3$ to $1\times10^{20}/cm^3$, and the N−-type epitaxial layer 103 has an impurity concentration in a range from $1\times10^{15}/cm^3$ to $5\times10^{15}/cm^3$. After application and development of a photoresist 420, boron is implanted into a portion where stripe-shaped diffusion layers are to be formed at a high energy in a range from 500 keV to 2 MeV with the photoresist 420 used as a mask; thus, a plurality of stripe-shaped P-type diffusion layers 109 are formed. Each of the stripe-shaped P-type diffusion layers 109 has an impurity concentration almost equal to that of the N-type epitaxial layer 103.

Figure 3:
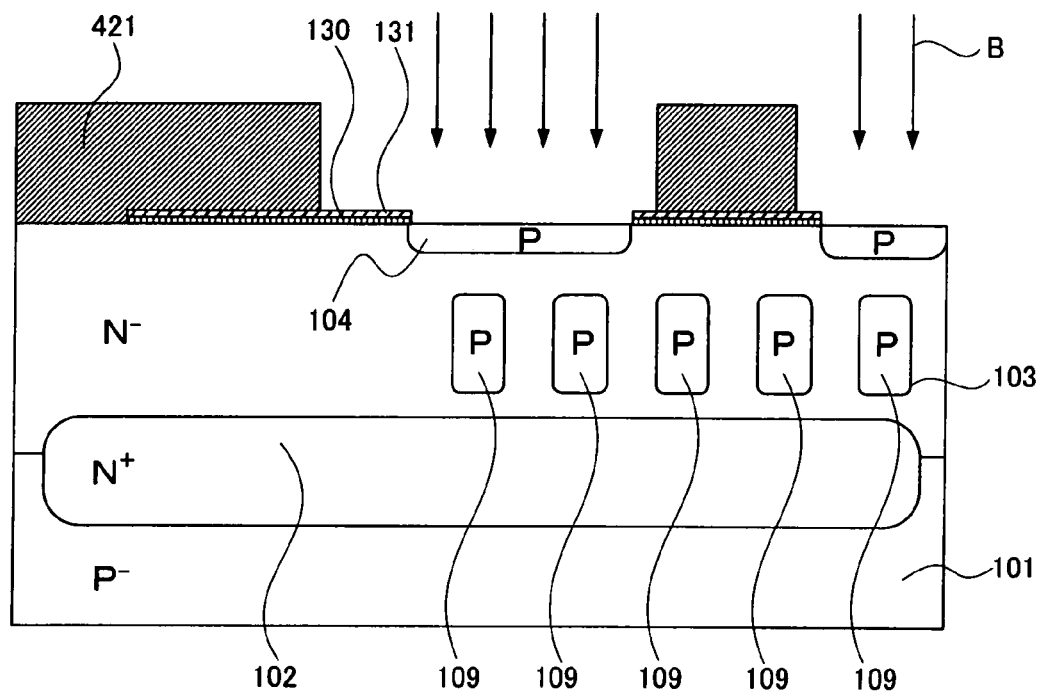

After removal of the photoresist 420, as illustrated in FIG. 3, an oxide film 130 is formed on the N−-type epitaxial layer 103 and a nitride film 131 is formed on the oxide film 130. Then, the oxide film 130 and the nitride film 131 are patterned on a portion where an active region is to be formed.

After application and development of a photoresist 421, boron is implanted into a portion where a LOCOS offset region is to be formed with the photoresist 421 used as a mask; thus, a P-type offset layer 104 is formed. Herein, a dose amount of boron to be implanted into the P-type offset layer 104 is in a range from $7\times10^{12}/cm^2$ to $1.5\times10^{13}/cm^2$.

After removal of the photoresist 421 illustrated in FIG. 3, a LOCOS oxide film 105 is grown on the P-type offset layer 104 with the nitride film 131 used as a mask. The LOCOS oxide film 105 is formed by heat treatment such as pyrogenic oxidation, which is performed at 1000° C. for 100 minutes, for example. Herein, the LOCOS oxide film 105 has a thickness in a range from 400 nm to 600 nm.

Figure 4:
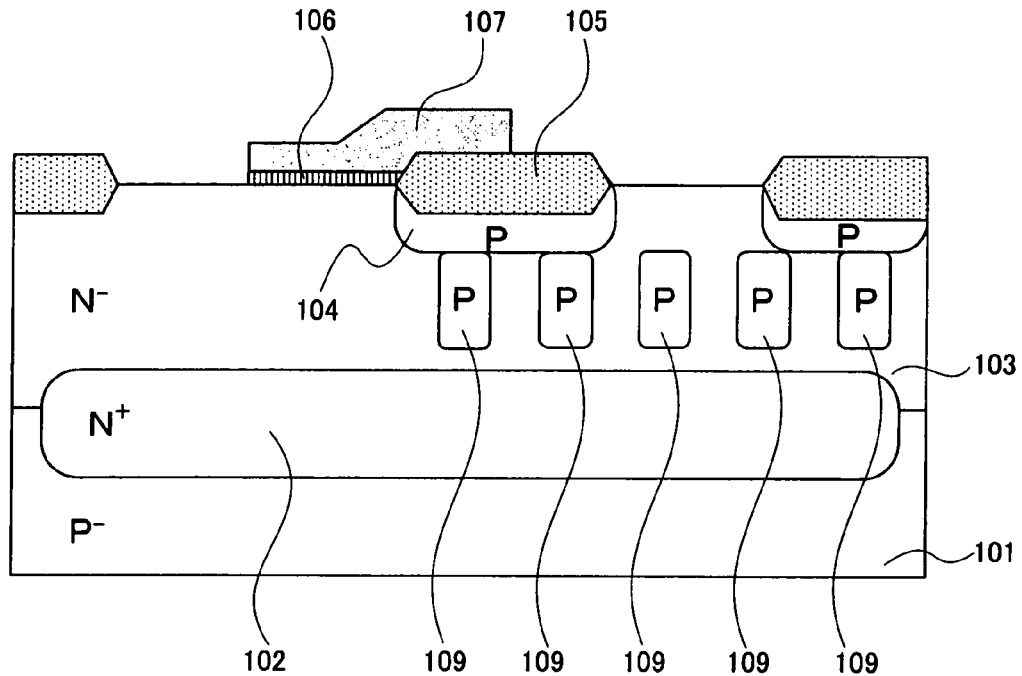

Next, as illustrated in FIG. 4, a gate oxide film 106 is formed at a portion where a gate of a transistor is to be formed. Then, a gate electrode 107 made of polysilicon is formed on the gate oxide film 106 so as to partially cover the LOCOS oxide film 105 on a drain side.

Figure 5:
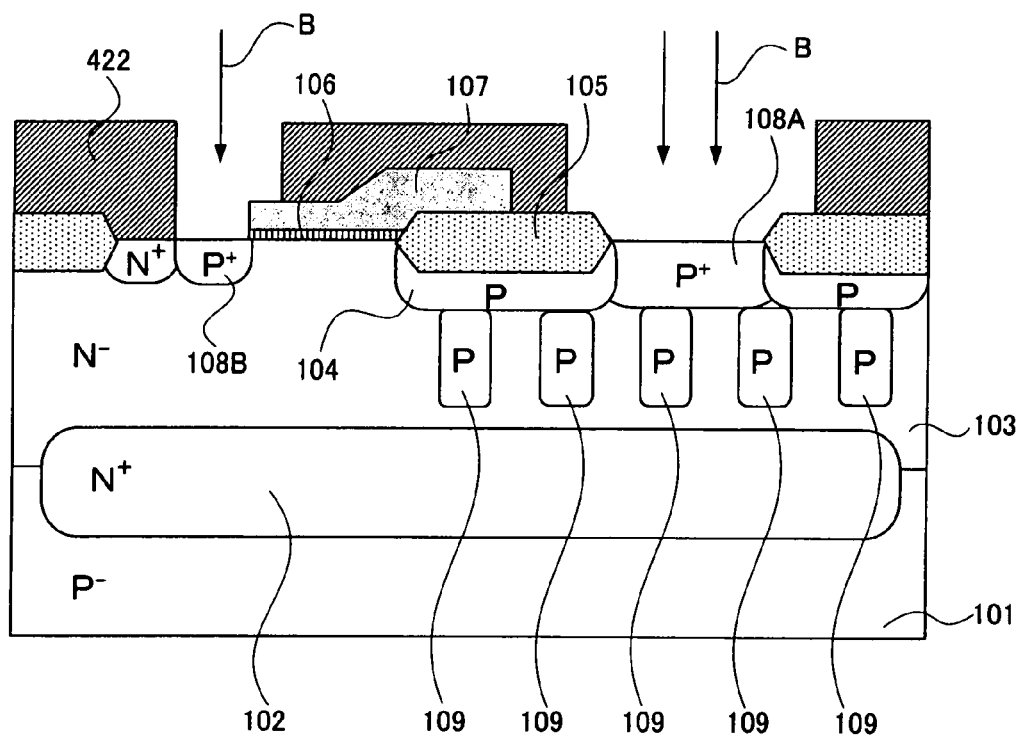

Next, as illustrated in FIG. 5, a P+-type high concentration drain layer 108A is formed by boron implantation in a self-aligned manner with respect to the LOCOS oxide film 105 on the P-type offset layer 104. At a region opposite to the drain region with the gate electrode 107 interposed therebetween, moreover, a P+-type high concentration source layer 108B is formed by boron implantation in a self-aligned manner with respect to the gate electrode 107. The P+-type high concentration drain layer 108A is equal to the P+-type high concentration source layer 108B in terms of a diffusion layer. Herein, the dose amount of boron to be implanted into each of the P+-type high concentration drain layer 108A and the P+-type high concentration source layer 108B is in a range from $2\times10^{15}/cm^2$ to $6\times10^{15}/cm^2$.

Although not illustrated in FIG. 5, next, a PSG film is formed as an interlayer insulating film. Then, connection holes (contacts) are provided in the P+-type high concentration drain layer 108A, the P+-type high concentration source layer 108B and the gate electrode 107, respectively, and an aluminum wire and a passivation film are formed. Thus, a semiconductor device is completed. Herein, a photoresist 422 is also illustrated in FIG. 5.

By this manufacturing method, a portion between the diffusion layer ranging from the P-type offset layer 104 to the P+-type high concentration drain layer 108A and the N+-type buried layer 102 is depleted completely, so that an electric field strength is uniform. As a result, it is possible to improve a withstand voltage between the P+-type high concentration drain layer 108A and the N+-type buried layer 102. In addition, by the formation of the plurality of stripe-shaped P-type diffusion layers 109, the drain region becomes widened. As a result, it is possible to reduce on-resistance. Further, the concentration of the N+-type buried layer 102 is sufficiently high. As a result, it is possible to suppress an operation of a parasitic bipolar transistor.

Second Embodiment

Figure 6:
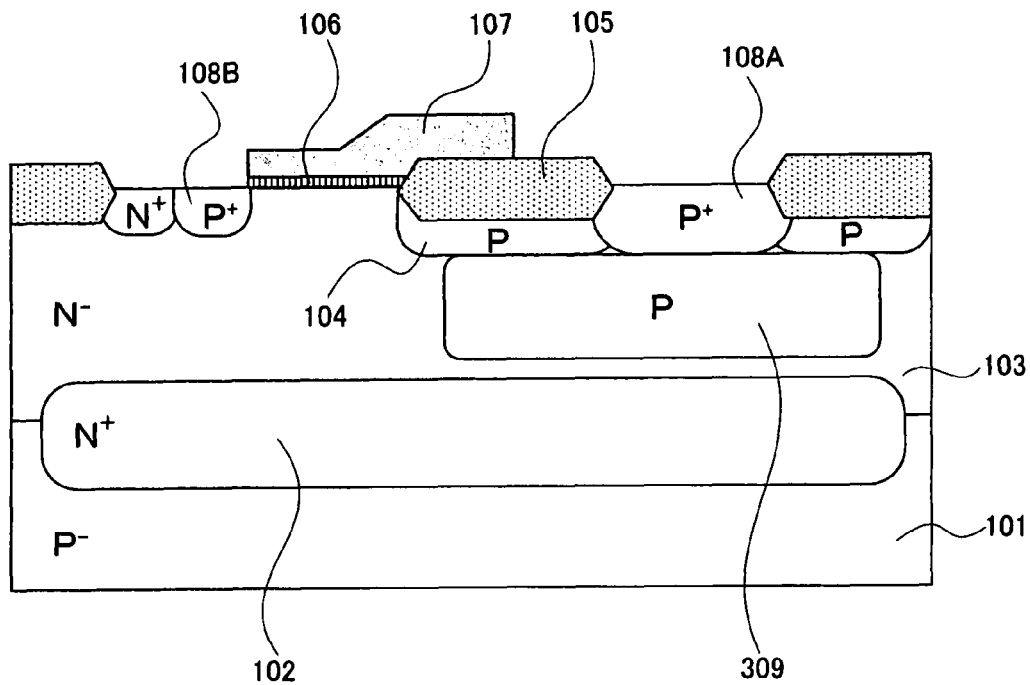
FIG. 6 is a sectional view illustrating a semiconductor device according to a second embodiment of the present invention.

FIG. 6 is a sectional view illustrating a semiconductor device according to a second embodiment of the present invention.

Figure 7:
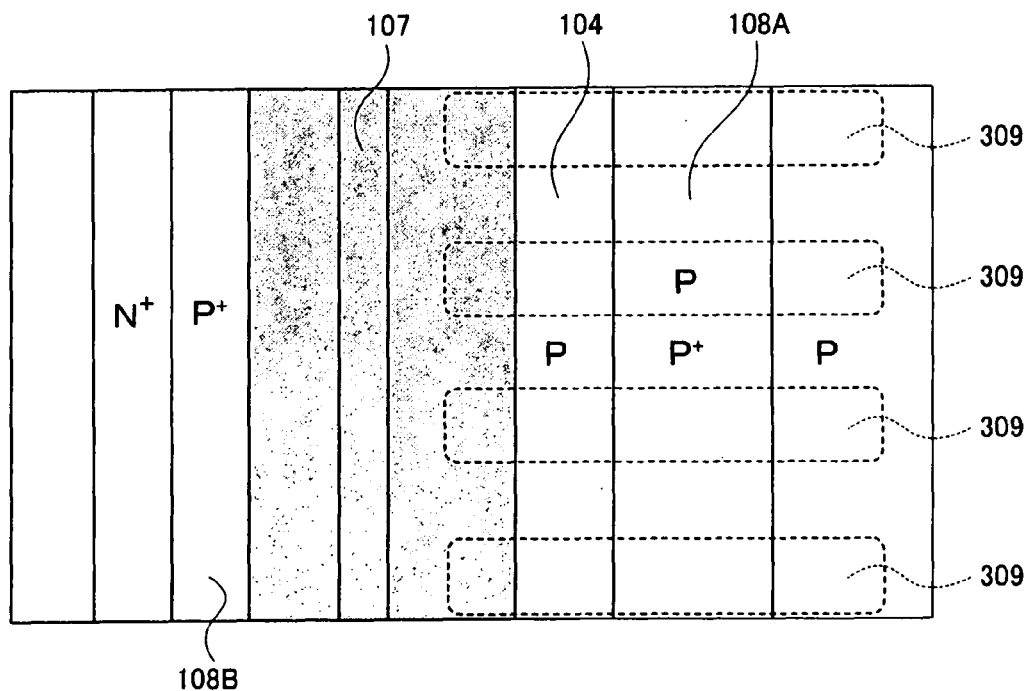
FIG. 7 is a plan view illustrating the semiconductor device according to the second embodiment.

FIG. 7 is a plan view illustrating the semiconductor device according to the second embodiment.

The second embodiment is superior to the first embodiment in point of reduction in on-resistance.

In the semiconductor device according to the second embodiment, a plurality of stripe-shaped P-type diffusion layers 309 are formed below a diffusion layer ranging from a P-type offset layer 104 to a P+-type high concentration drain layer 108A in parallel with a drain-source direction at predetermined intervals, for example, regular intervals. Herein, a LOCOS oxide film 105 is not illustrated in FIG. 7.

Specifically, the LOCOS oxide film 105 is formed between the P+-type high concentration drain layer 108A and an end of a gate electrode 107 made of polysilicon such that the end of the gate electrode 107 is offset from the P+-type high concentration drain layer 108A serving as a drain region. In addition, the P-type offset layer 104 of a conductivity type equal to that of the drain region is formed below the LOCOS oxide film 105, and an N+-type buried layer 102 is entirely formed over an active region.

Further, the plurality of stripe-shaped P-type diffusion layers 309 are formed below the diffusion layer ranging from the P-type offset layer 104 to the P+-type high concentration drain layer 108A in parallel with the drain-source direction.

In the semiconductor device, the plurality of stripe-shaped diffusion layers formed in parallel with the drain-source direction are also parallel with an electric current path. As a result, it is possible to further reduce on-resistance in comparison with the first embodiment.

Third Embodiment

FIGS. 8 to 12 illustrate a third embodiment of the present invention.

Typically, the high-energy boron implantation in the first embodiment is unsuitable for formation of a diffusion layer with a high concentration. According to the third embodiment, it is possible to form a stripe-shaped diffusion layer with a higher concentration so as to further reduce on-resistance.

Figure 8:
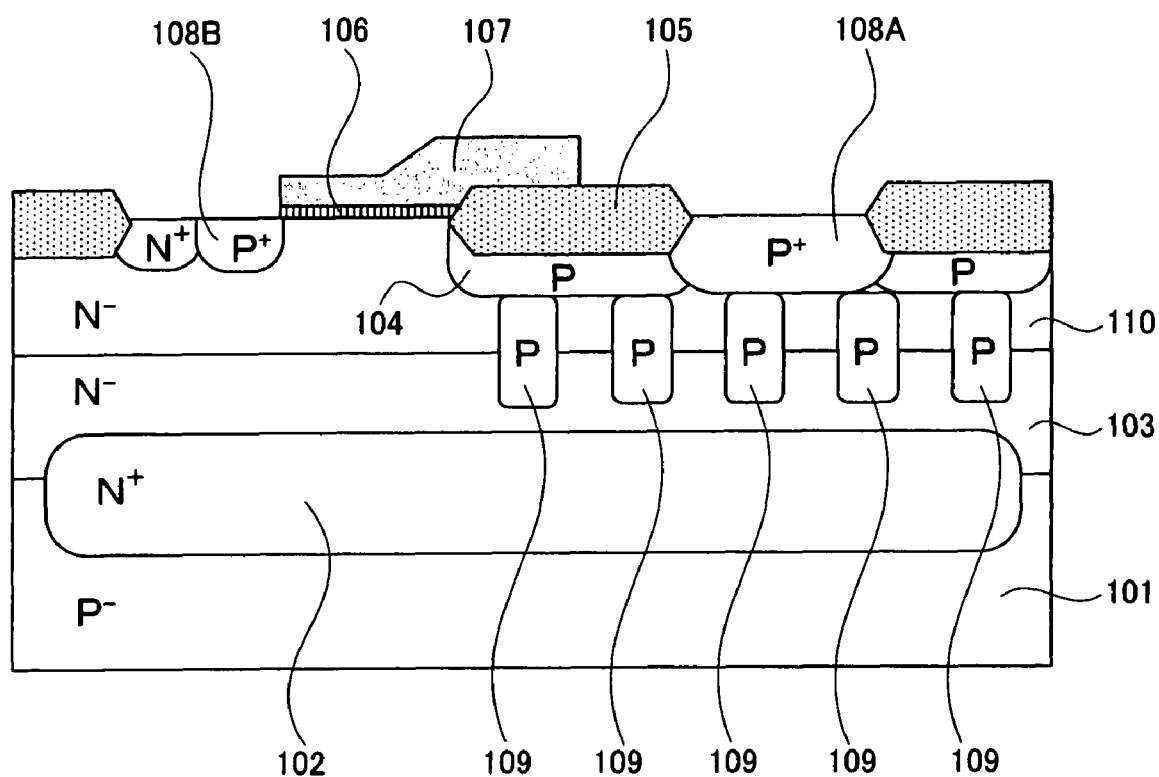
FIG. 8 is a sectional view illustrating a semiconductor device according to a third embodiment of the present invention.

FIG. 8 illustrates a high withstand voltage MOS transistor of a LOCOS offset drain type according to the third embodiment. FIGS. 9 to 12 illustrate a method of manufacture of such semiconductor device.

Figure 9:
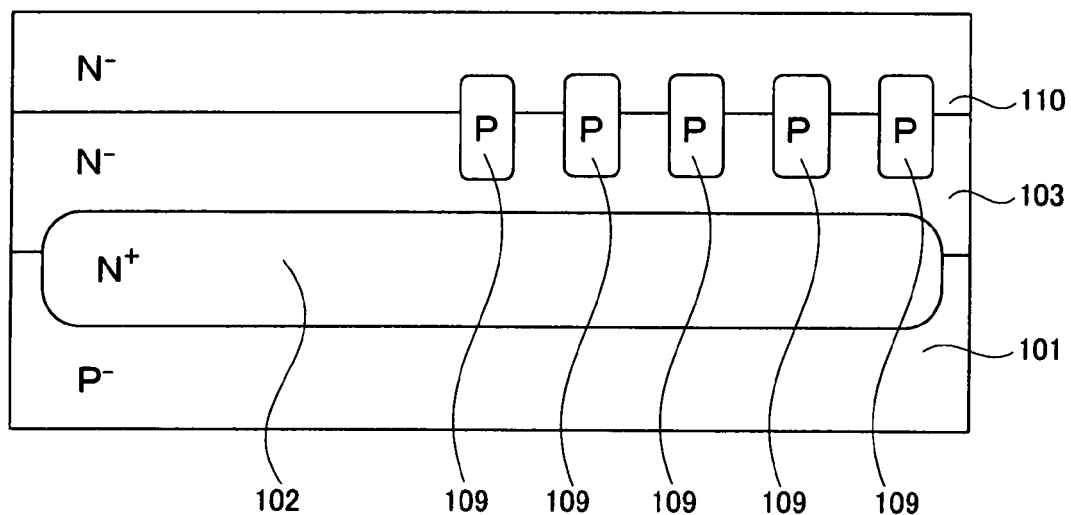
FIGS. 9 to 12 are sectional views each illustrating a method of manufacture of the semiconductor device according to the third embodiment.

First, as illustrated in FIG. 9, an N$^+$-type buried layer 102 and an N$^-$-type epitaxial layer 103 are sequentially formed in a P$^-$-type silicon substrate 101. Herein, the N$^+$-type buried layer 102 has an impurity concentration in a range from $1\times10^{18}$/cm$^3$ to $1\times10^{20}$/cm$^3$, and the N$^-$-type epitaxial layer 103 has an impurity concentration in a range from $1\times10^{15}$/cm$^3$ to $5\times10^{15}$/cm$^3$.

Next, a plurality of stripe-shaped P-type diffusion layers 109 are formed on the N$^-$-type epitaxial layer 103. Then, an N$^-$-type epitaxial layer 110 is formed on the N-type epitaxial layer 103.

Figure 10:
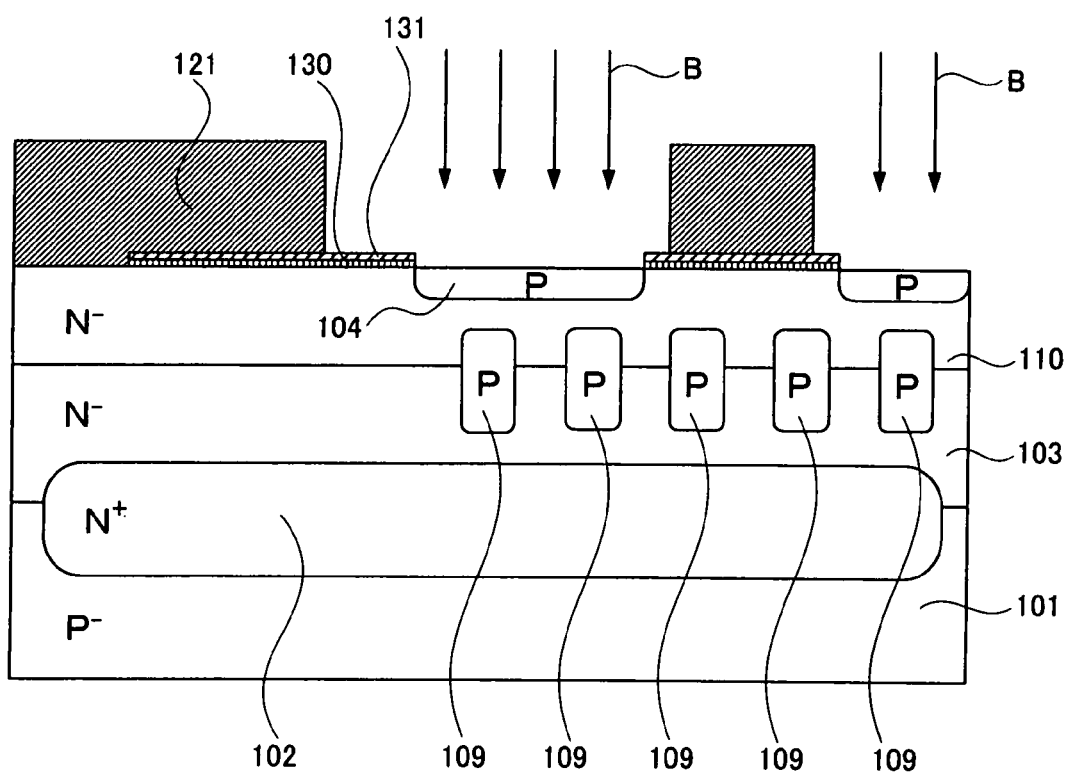

Next, an oxide film 130 is formed on the N$^-$-type epitaxial layer 110 and a nitride film 131 is formed on the oxide film 130 (a lamination state is illustrated in FIG. 10). Then, the oxide film 130 and the nitride film 131 are patterned on a portion where an active region is to be formed.

After application and development of a photoresist 121 as illustrated in FIG. 10, boron is implanted into a portion intended for formation of a LOCOS offset region with the photoresist 121 used as a mask; thus, a P-type offset layer 104 is formed. Herein, the dose amount of boron to be implanted into the P-type offset layer 104 is in a range from $7\times10^{12}$/cm$^2$ to $1.5\times10^{13}$/cm$^2$.

Figure 11:
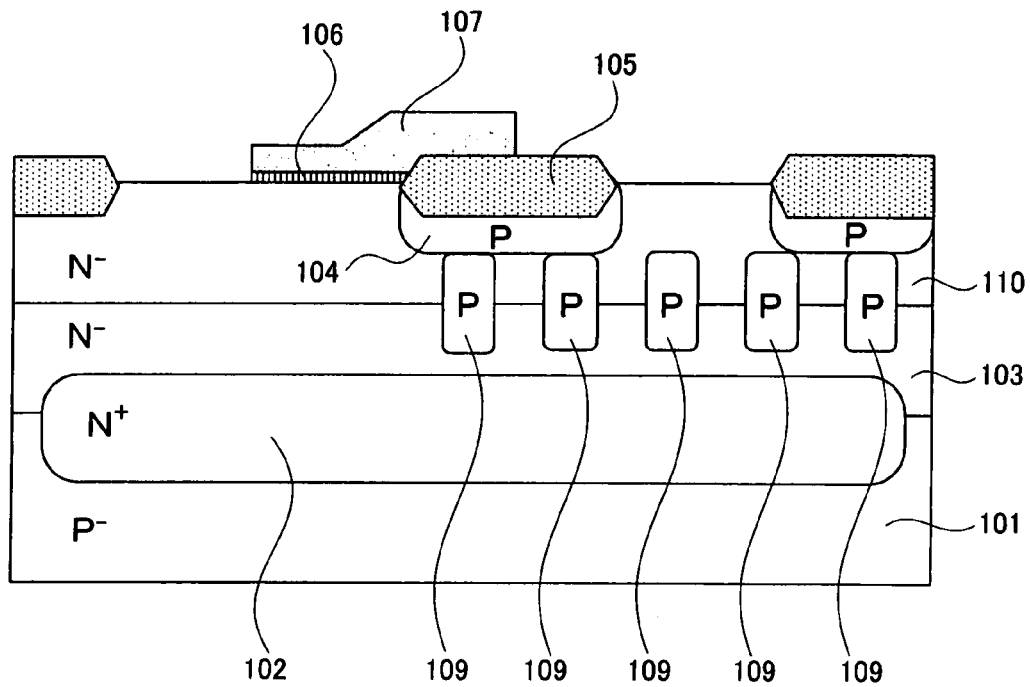

After removal of the photoresist 121 illustrated in FIG. 10, next, a LOCOS oxide film 105 is grown on the P-type offset layer 104 with the nitride film 131 used as a mask as illustrated in FIG. 11. The LOCOS oxide film 105 is formed by heat treatment such as pyrogenic oxidation performed at 1000° C. for 100 minutes, for example. Herein, the LOCOS oxide film 105 has a thickness in a range from 400 nm to 600 nm. Next, a gate oxide film 106 is formed at a portion where a gate of a transistor is to be formed. Then, a gate electrode 107 made of polysilicon is formed on the gate oxide film 106 so as to partially cover the LOCOS oxide film 105 on a drain side.

Figure 12:
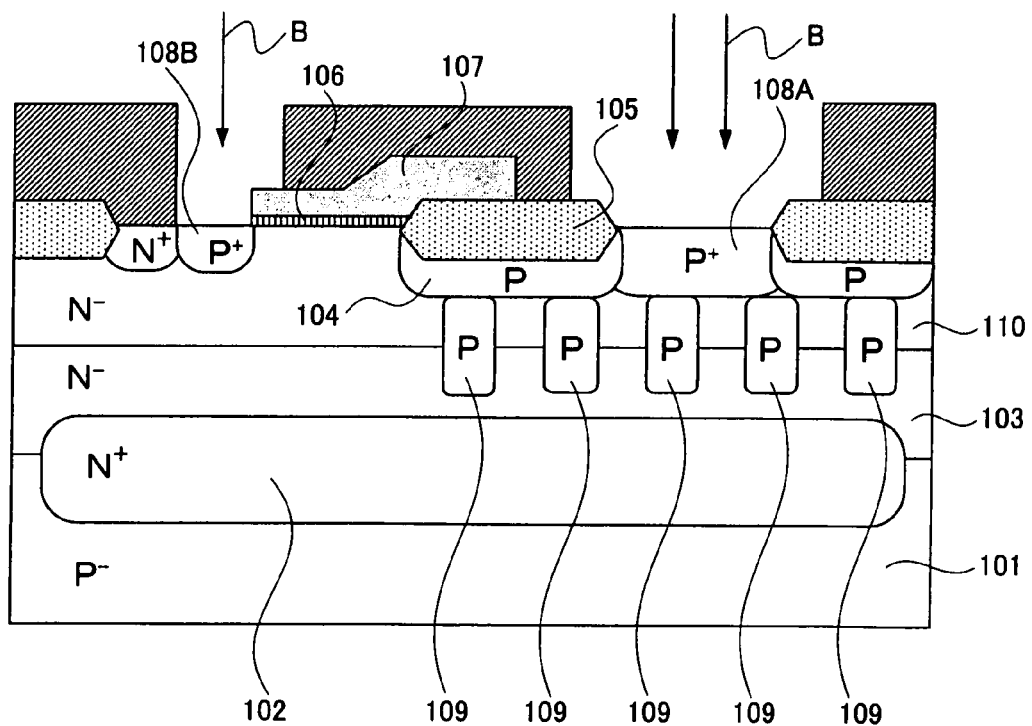

Next, as illustrated in FIG. 12, a P$^+$-type high concentration drain layer 108A is formed in the P-type offset layer 104 by boron implantation in a self-aligned manner with respect to the LOCOS oxide film 105 on the P-type offset layer 104. At a region opposite to the drain region with the gate electrode 107 interposed therebetween, moreover, a P$^+$-type high concentration source layer 108B is formed by boron implantation in a self-aligned manner with respect to the gate electrode 107. The P$^+$-type high concentration drain layer 108A is equal to the P$^+$-type high concentration source layer 108B in terms of a diffusion layer. Herein, the dose amount of boron to be implanted into each of the P$^+$-type high concentration drain layer 108A and the P$^+$-type high concentration source layer 108B is in a range from $2\times10^{15}$/cm$^2$ to $6\times10^{15}$/cm$^2$.

Although not illustrated in FIG. 12, a PSG film is formed as an interlayer insulating film. Then, connection holes (contacts) are provided in the P$^+$-type high concentration drain layer 108A, the P$^+$-type high concentration source layer 108B and the gate electrode 107, respectively, and an aluminum wire and a passivation film are formed. Thus, a semiconductor device is completed.

By this manufacturing method, the stripe-shaped diffusion layer is not formed by high-energy boron implantation and, therefore, has a higher concentration. Thus, the drain region in the third embodiment is higher in concentration than that in the first embodiment. As a result, it is possible to further reduce on-resistance.

Fourth Embodiment

FIGS. 13 to 17 illustrate a fourth embodiment of the present invention.

According to the first embodiment, it is possible to sufficiently suppress an operation of a vertical parasitic bipolar transistor. According to the fourth embodiment, it is possible to completely suppress an operation of a vertical parasitic bipolar transistor and to further improve a withstand voltage. In order to attain such effects, a buried oxide film 602 is entirely formed over an active region.

Figure 13:
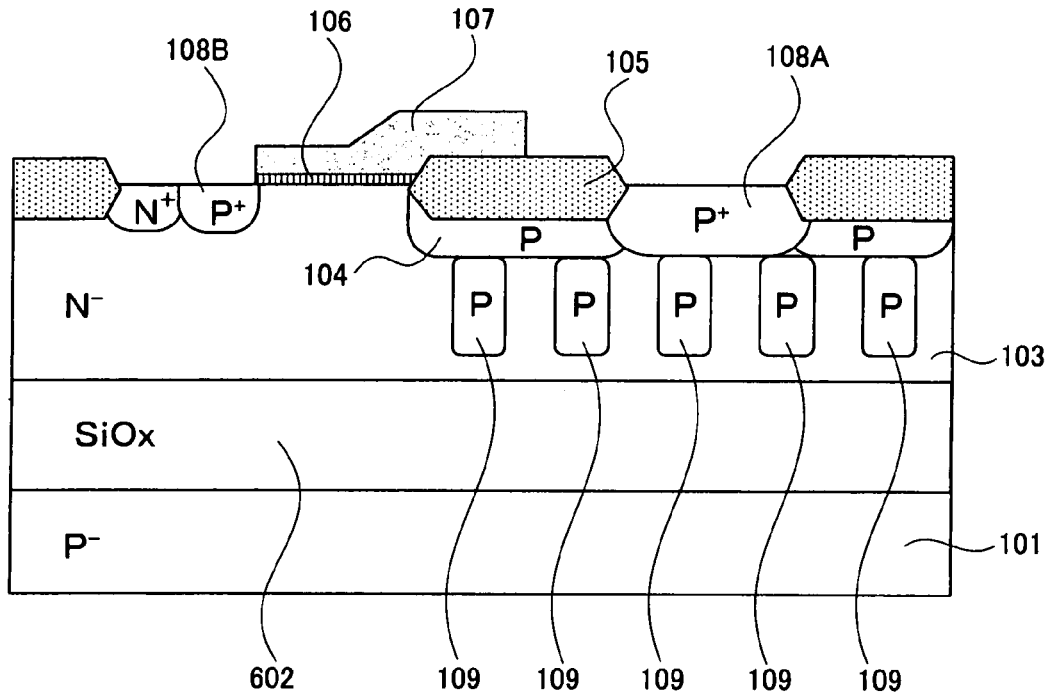
FIG. 13 is a sectional view illustrating a semiconductor device according to a fourth embodiment of the present invention.

Specifically, as illustrated in FIG. 13, a LOCOS oxide film 105 is formed between a P$^+$-type high concentration drain layer 108A and an end of a gate electrode 107 made of polysilicon in a dielectric isolation substrate such that the end of the gate electrode 107 is offset from the P$^+$-type high concentration drain layer 108A serving as a drain region. In addition, a P-type offset layer 104 of a conductivity type equal to that of the drain region is formed below the LOCOS oxide film 105, and the buried oxide layer 602 is entirely formed over the active region. Further, a plurality of stripe-shaped P-type diffusion layers 109 are formed below a diffusion layer ranging from the P-type offset layer 104 to the P$^+$-type high concentration drain layer 108A. Herein, a gate oxide film 106 is also illustrated in FIG. 13.

FIGS. 14 to 17 illustrate a method of manufacture of the high withstand voltage MOS transistor of the LOCOS offset drain type according to the fourth embodiment.

Figure 14:
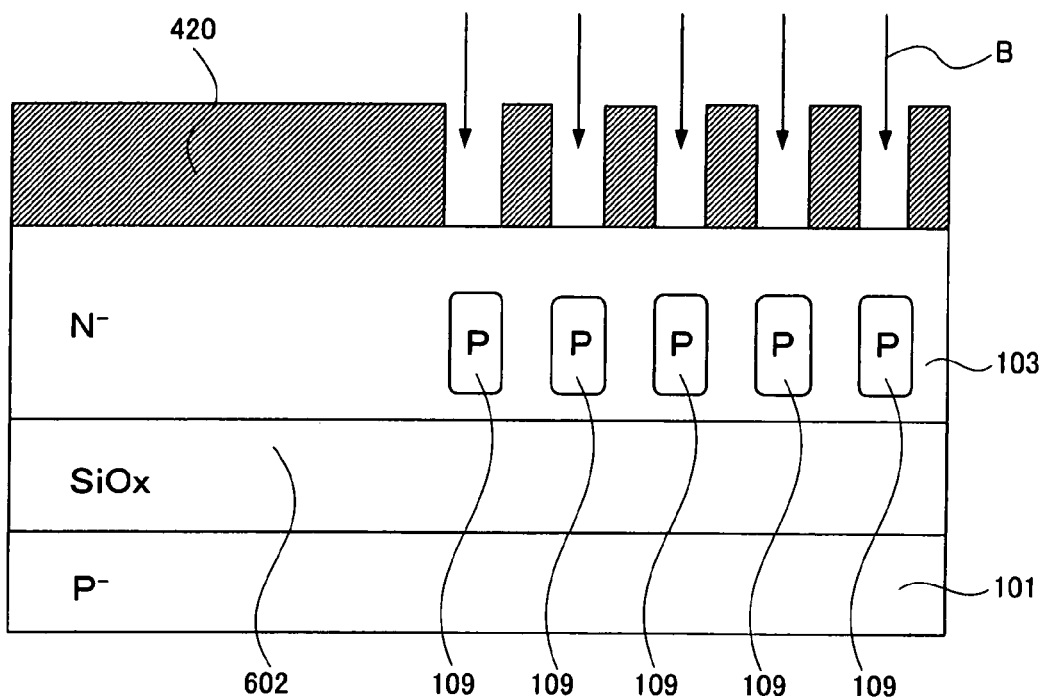
FIGS. 14 to 17 are sectional views each illustrating a method of manufacture of the semiconductor device according to the fourth embodiment.
Figure 15:
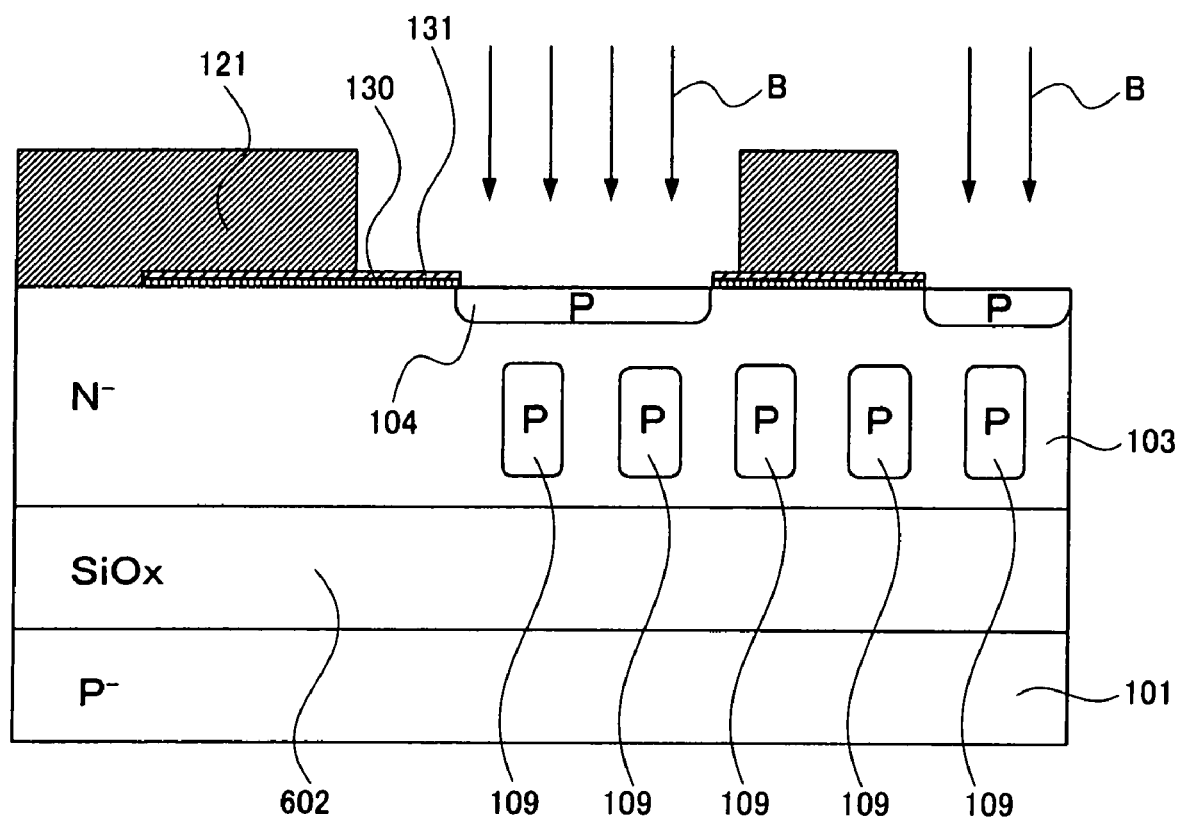

First, as illustrated in FIG. 14, there is prepared an SOI substrate having a structure in which a buried oxide film 602 and an N$^-$-type epitaxial layer 103 are sequentially formed on a P$^-$-type silicon substrate 101. Herein, the buried oxide film 602 has a thickness in a range from 0.5 μm to 3 μm. After application and development of a photoresist 420, boron is implanted into a portion where stripe-shaped diffusion layers are to be formed at a high energy in a range from 500 keV to 2 MeV with the photoresist 420 used as a mask; thus, a plurality of stripe-shaped P-type diffusion layers 109 are formed. Each of the stripe-shaped P-type diffusion layers 109 has an impurity concentration almost equal to that of the N$^-$-type epitaxial layer 103. Next, an oxide film 130 is formed on the N$^-$-type epitaxial layer 103 and a nitride film 131 is formed on the oxide film 130 (a lamination state is illustrated in FIG. 15). Then, the oxide film 130 and the nitride film 131 are patterned on a portion where an active region is to be formed.

After removal of the photoresist 420 illustrated in FIG. 14 and then, application and development of a photoresist 121, boron is implanted into a portion where a LOCOS offset region is to be formed with the photoresist 121 and the patterned nitride film 131 each used as a mask; thus, a P-type offset layer 104 is formed as illustrated in FIG. 15. Herein, the dose amount of boron to be implanted into the P-type offset layer 104 is in a range from $7 \times 10^{12}/cm^2$ to $1.5 \times 10^{13}/cm^2$.

Figure 16:
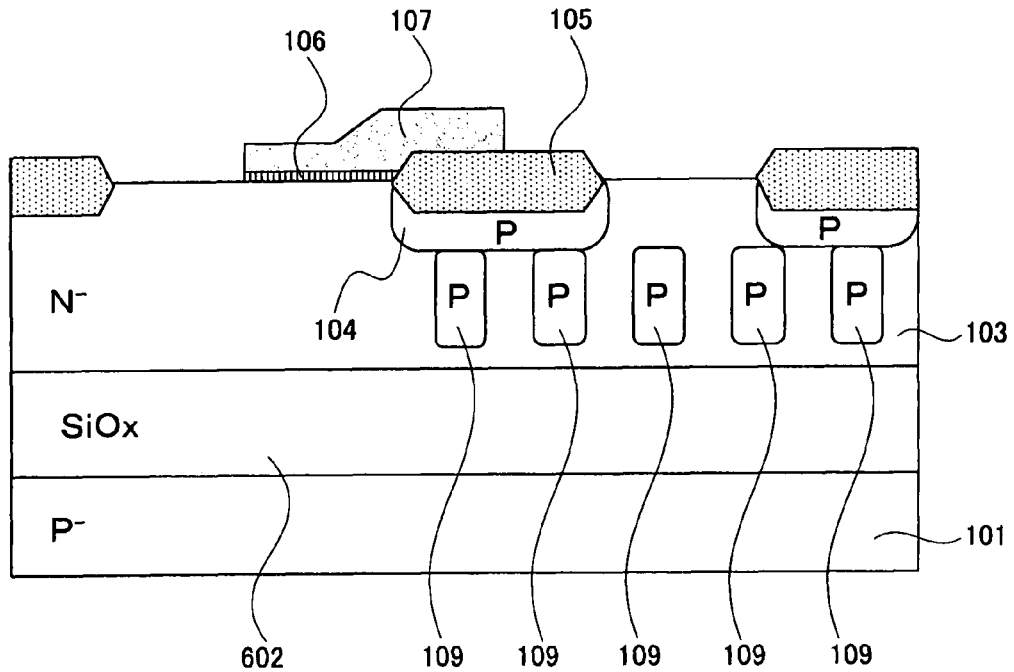

After removal of the photoresist 121 illustrated in FIG. 15, a LOCOS oxide film 105 is grown on the P-type offset layer 104 with the nitride film 131 used as a mask, as illustrated in FIG. 16. The LOCOS oxide film 105 is formed by heat treatment such as pyrogenic oxidation performed at 1000° C. for 100 minutes, for example. Herein, the LOCOS oxide film 105 has a thickness in a range from 400 nm to 600 nm. After removal of the nitride film 131, a gate oxide film 106 is formed on a surface of the N⁻-type epitaxial layer 103 where a gate of a transistor is to be formed. Then, a gate electrode 107 made of polysilicon is formed on the gate oxide film 106 so as to partially cover the LOCOS oxide film 105 on a drain side.

Figure 17:
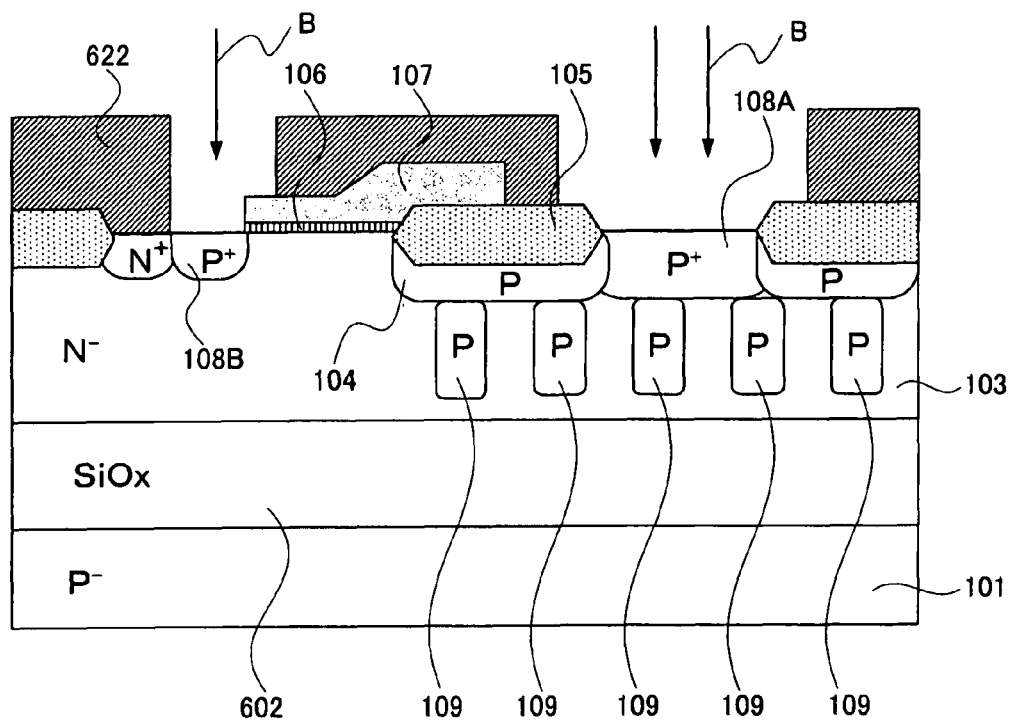
Figure 18:
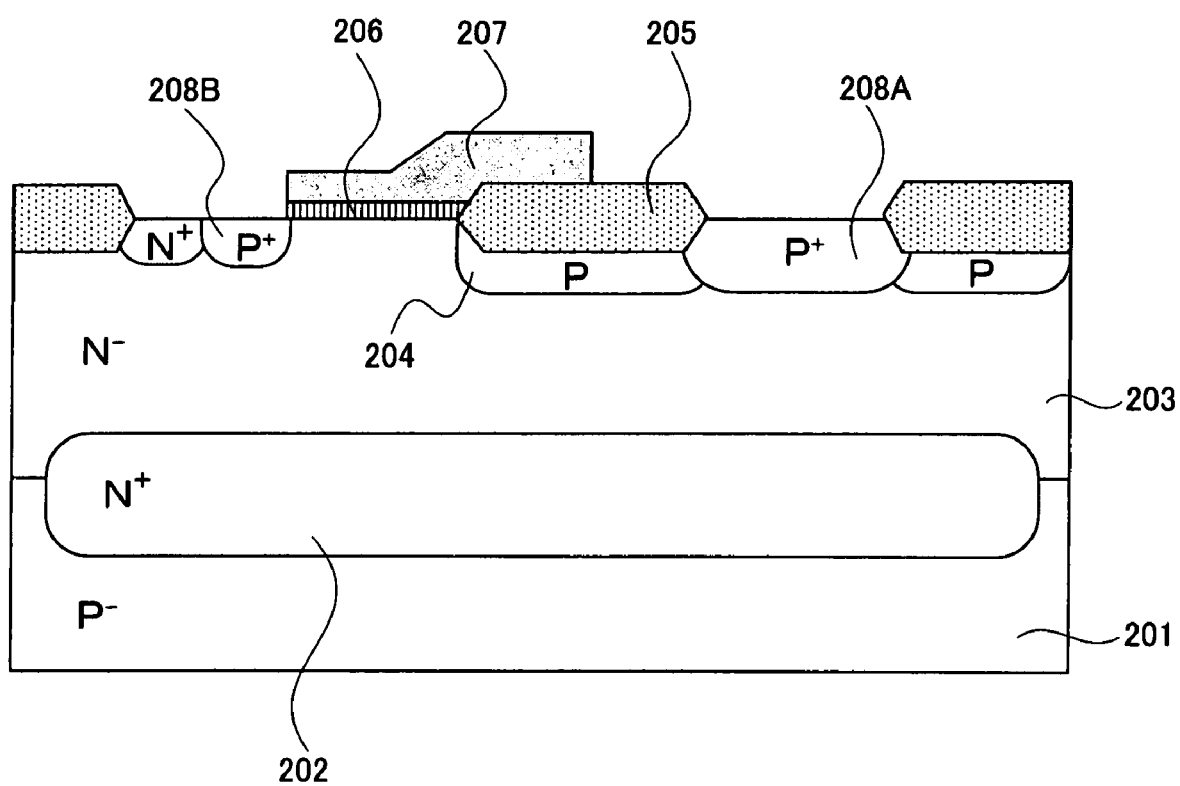
FIG. 18 is a sectional view illustrating a conventional semiconductor device.

Next, as illustrated in FIG. 17, a P⁺-type high concentration drain layer 108A is formed by boron implantation in a self-aligned manner with respect to the LOCOS oxide film 105 on the P-type offset layer 104. At a region opposite to the drain region with the gate electrode 107 interposed therebetween, moreover, a P⁺-type high concentration source layer 108B is formed by boron implantation in a self-aligned manner with respect to the gate electrode 107. The P⁺-type high concentration drain layer 108A and the P⁺-type high concentration source layer 108B are formed concurrently. Herein, the dose amount of boron to be implanted into each of the P⁺-type high concentration drain layer 108A and the P⁺-type high concentration source layer 108B is in a range from $2 \times 10^{15}/cm^2$ to $6 \times 10^{15}/cm^2$.

Although not illustrated in FIG. 17, a PSG film is formed as an interlayer insulating film. Then, connection holes (contacts) are provided in the P⁺-type high concentration drain layer 108A, the P⁺-type high concentration source layer 108B and the gate electrode 107, respectively, and an aluminum wire and a passivation film are formed. Thus, a semiconductor device is completed.

By this manufacturing method, the buried oxide film 602 is formed at a portion corresponding to a base of a vertical parasitic bipolar transistor. As a result, it is possible to completely suppress an operation of the parasitic bipolar transistor.

In addition, the formation of the plurality of stripe-shaped P-type diffusion layers 109 has an advantage over the non-formation thereof in the following. That is, a depletion layer extends from a junction between the plurality of stripe-shaped P-type diffusion layers 109 and the N⁻-type epitaxial layer 103 and therefore, reaches the buried oxide film 602 at a lower voltage; thus, the drain region is readily depleted. As a result, it is possible to further improve a withstand voltage.

Also in the third or fourth embodiment, when the plurality of stripe-shaped diffusion layers are formed in parallel with a drain-source direction similarly to the second embodiment, such stripe-shaped diffusion layers are parallel with an electric current path. As a result, it is possible to further reduce on-resistance.

The present invention is useful in a high withstand voltage MOS transistor of a LOCOS offset drain type and a method of manufacture thereof.

What is claimed is:

1. A semiconductor device including an offset drain-type MOS transistor having a channel of a first conductivity type on a semiconductor substrate, the semiconductor device comprising:
a semiconductor substrate of a first conductivity type;
a semiconductor layer of a second conductivity type on the semiconductor substrate;
a buried layer of the second conductivity type between the semiconductor substrate and the semiconductor layer;
a drain region including a high concentration drain layer of the first conductivity type on a surface of the semiconductor layer;
a source region including a high concentration source layer of the first conductivity type on the surface of the semiconductor layer;
a gate oxide film between the drain region and the source region and on an active region on the surface of the semiconductor layer;
a LOCOS oxide film between the drain region and the gate oxide film and on the surface of the semiconductor layer;
a gate electrode on the gate oxide film, partially covering the LOCOS oxide film;
an offset layer of the first conductivity type below the LOCOS oxide film; and
a plurality of diffusion layers of the first conductivity type in striped shapes at nearly the same depth and directly beneath the offset layer and the drain layer in and parallel to the surface of the semiconductor layer.

2. The semiconductor device according to claim 1, wherein each of the plurality of diffusion layers is extended along a direction facing the source region from the drain region.

3. A semiconductor device including an offset drain-type MOS transistor having a channel of a first conductivity type on a semiconductor substrate, the semiconductor device comprising:
a semiconductor substrate of a first conductivity type;
a buried oxide film on the semiconductor substrate;
a semiconductor layer of a second conductivity type on the buried oxide film;
a drain region including a high concentration drain layer of the first conductivity type on a surface of the semiconductor layer;
a source region including a high concentration source layer of the first conductivity type on the surface of the semiconductor layer;
a gate oxide film between the drain region and the source region and on an active region on the surface of the semiconductor layer;
a LOCOS oxide film between the drain region and the gate oxide film and on the surface of the semiconductor layer;
a gate electrode on the gate oxide film, partially covering the LOCOS oxide film;
an offset layer of the first conductivity type below the LOCOS oxide film; and
a plurality of diffusion layers of the first conductivity type in striped shapes at nearly the same depth and directly beneath the offset layer and the drain layer in and parallel to the surface of the semiconductor layer.

4. A method of manufacture of a semiconductor device including an offset drain-type MOS transistor having a channel of a first conductivity type formed on a semiconductor substrate, the method comprising the steps of:
forming a buried layer of a second conductivity type on a semiconductor substrate of a first conductivity type;
forming an epitaxial layer of the second conductivity type on the semiconductor substrate;
forming a plurality of diffusion layers of the first conductivity type in the epitaxial layer by high-energy impurity implantation;
forming a nitride film on the epitaxial layer with an oxide film interposed therebetween;
patterning the nitride film on an active region on the epitaxial layer;

forming an offset layer of the first conductivity type on the epitaxial layer with the nitride film as a mask;

forming a LOCOS oxide film on a surface of the epitaxial layer with the nitride film as a mask;

removing the nitride film after the formation of the LOCOS oxide film;

forming a gate oxide film on the active region on the surface of the epitaxial layer;

forming a gate electrode on the gate oxide film so as to partially cover the LOCOS oxide film; and forming a high concentration drain layer of the first conductivity type on a drain region of the epitaxial layer adjacent to the offset layer, and forming a high concentration source layer of the first conductivity type on the epitaxial layer at a position opposite to the high concentration drain layer of the first conductivity type with the gate electrode interposed therebetween, wherein the plurality of diffusion lavers of the first conductivity type are in striped shapes at nearly the same depth and directly beneath the offset layer and the drain layer in and parallel to the surface of the epitaxial layer.

5. A method of manufacture of a semiconductor device including an offset drain-type MOS transistor having a channel of a first conductivity type formed on a semiconductor substrate, the method comprising the steps of:

forming a buried layer of a second conductivity type on a semiconductor substrate of a first conductivity type;

forming a first epitaxial layer of the second conductivity type on the semiconductor substrate;

forming a plurality of diffusion layers of the first conductivity type on the first epitaxial layer;

forming a second epitaxial layer of the second conductivity type on the first epitaxial layer having the plurality of diffusion layers formed thereon;

forming a nitride film on the second epitaxial layer with an oxide film interposed therebetween;

patterning the oxide film and the nitride film at a portion where an active region is to be formed on the second epitaxial layer;

forming an offset layer of the first conductivity type on the second epitaxial layer with the nitride film as a mask;

forming a LOCOS oxide film on a surface of the second epitaxial layer with the nitride film as a mask;

removing the nitride film after the formation of the LOCOS oxide film;

forming a gate oxide film on the active region on the surface of the second epitaxial layer;

forming a gate electrode on the gate oxide film so as to partially cover the LOCOS oxide film; and forming a high concentration drain layer of the first conductivity type on a drain region of the second epitaxial layer adjacent to the offset layer, and forming a high concentration source layer of the first conductivity type on the second epitaxial layer at a position opposite to the high concentration drain layer of the first conductivity type with the gate electrode interposed therebetween, wherein the plurality of diffusion layers of the first conductivity type are in striped shapes at nearly the same depth and directly beneath the offset layer and the drain layer in and parallel to the surface of the first epitaxial layer.

6. A method of manufacture of a semiconductor device including an offset drain-type MOS transistor having a channel of a first conductivity type formed on a semiconductor substrate, the method comprising the steps of:

forming a semiconductor layer of a second conductivity type on a buried oxide film in a semiconductor substrate of a first conductivity type;

forming a plurality of diffusion layers of the first conductivity type in the semiconductor layer;

forming a nitride film on the semiconductor layer with an oxide film interposed therebetween;

patterning the nitride film on an active region on the semiconductor layer;

forming an offset layer of the first conductivity type on the semiconductor layer with the nitride film as a mask;

forming a LOCOS oxide film on a surface of the semiconductor layer with the nitride film as a mask;

removing the nitride film after the formation of the LOCOS oxide film;

forming a gate oxide film on the active region on the surface of the semiconductor layer;

forming a gate electrode on the gate oxide film so as to partially cover the LOCOS oxide film; and forming a high concentration drain layer of the first conductivity type on a drain region of the semiconductor layer adjacent to the offset layer, and forming a high concentration source layer of the first conductivity type on the semiconductor layer at a position opposite to the high concentration drain layer of the first conductivity type with the gate electrode interposed therebetween, wherein the plurality of diffusion layers of the first conductivity type are in striped shapes at nearly the same depth and directly beneath the offset layer and the drain layer in and parallel to the surface of the semiconductor layer.

* * * * *